United States Patent
Tamai et al.

(10) Patent No.: US 6,248,144 B1
(45) Date of Patent: Jun. 19, 2001

(54) PROCESS FOR PRODUCING POLISHING COMPOSITION

(75) Inventors: Kazusei Tamai; Katsuyoshi Ina, both of Aichi (JP)

(73) Assignee: Fujimi Incorporated, Nishikasugai-gun (JP)

(*) Notice: Subject to any disclaimer, the term of this patent is extended or adjusted under 35 U.S.C. 154(b) by 0 days.

(21) Appl. No.: 09/616,974

(22) Filed: Jul. 14, 2000

(30) Foreign Application Priority Data

Jul. 15, 1999 (JP) .................................................. 11-202181

(51) Int. Cl.$^7$ ............................ C01B 33/141; C09K 3/14; C09G 1/04; B01J 13/00
(52) U.S. Cl. ................................ 51/308; 106/3; 423/335; 516/86
(58) Field of Search .................................. 51/308; 106/3; 438/692, 693; 423/335, 336; 516/86

(56) References Cited

U.S. PATENT DOCUMENTS

| | | |
|---|---|---|
| 5,116,535 | 5/1992 | Cochrane . |
| 5,246,624 | 9/1993 | Miller et al. . |
| 5,904,159 * | 5/1999 | Kato et al. .............................. 51/308 |
| 6,027,669 | 2/2000 | Miura et al. . |

FOREIGN PATENT DOCUMENTS

| | | |
|---|---|---|
| 3-050112 | 3/1991 | (JP) . |
| 3-060420 | 3/1991 | (JP) . |

* cited by examiner

*Primary Examiner*—Michael Marcheschi
(74) *Attorney, Agent, or Firm*—Oblon, Spivak, McClelland, Maier & Neustadt, P.C.

(57) ABSTRACT

A process for producing a polishing composition, which comprises preliminarily adjusting water to pH 2–4, adding from 40 to 60 wt % of fumed silica to the water under high shearing force, adding water to lower the viscosity to 2–10000 cps, stirring the mixture under low shearing force for at least 5 minutes, adding water to lower the fumed silica concentration to 10–38 wt %, and adding a basic substance under vigorous stirring to raise the pH to 9–12.

8 Claims, No Drawings

PROCESS FOR PRODUCING POLISHING COMPOSITION

The present invention relates to a process for producing a polishing composition. More particularly, it relates to a process for producing a polishing composition suitable for planarization in production of semiconductor devices, especially for planarization of insulating interlayers.

Progress of so-called high-tech products including computers has been remarkable in recent years, and parts to be used for such products, such as ULSI, have been developed for integration and high speed, year after year. Along with such progress, the design rule for semiconductor devices has been progressively refined year after year, the depth of focus in a process for producing devices tends to be shallow, and planarization required for the pattern-forming surface tends to be increasingly severe. Further, to cope with an increase in resistance of the wiring due to refinement of the wiring, multilayer devices with shorter wiring have been employed. However, the irregularity in the surface level of a pattern formed has become problematic as an obstacle to multilayer devices.

Surface planarization for elimination of the irregularity is necessary in production of refined multilayer devices, and for planarization, spin-on-glass, resist-etch-batch and other planarization methods have been used.

These methods can achieve regional planarization but have difficulty in achieving global planarization required for advanced devices. Therefore, planarization is dominantly carried out by chemical mechanical polishing (hereinafter referred to as CMP), which is the combination of mechanical polishing and chemical polishing.

For CMP, a suspension (a polishing compositions, generally called a slurry) containing abrasive grains and some chemical components in water is usually used, and as the abrasive grains, alumina, ceria, silica or the like is usually used. Among them, alumina and ceria are likely to precipitate in polishing compositions due to their large specific gravities and therefore have a problem in dispersibility. They are also likely to form aggregates in polishing compositions and have a drawback that they often leave many polishing defects (hereinafter referred to as scratches) on the surface of a polished object.

Silica is classified as colloidal silica, fumed silica and others according to its production process. Colloidal silica is generally produced by growing particles of ultra-fine colloidal silica obtained by ion exchange of sodium silicate or by acid or alkali hydrolysis of an alkoxysilane. Colloidal silica produced by these wet methods is usually available as a slurry containing primary particles or secondary particles dispersed in water. Therefore, colloidal silica shows excellent dispersibility as abrasive grains in polishing compositions but imposes a limit on the mechanical stock removal rate. On the other hand, fumed silica is obtained by burning silicon tetrachloride, hydrogen and oxygen. Fumed silica obtained by the vapor phase method is in the form of secondary particles having a three-dimensional chain structure made of several to dozens of concatenated primary particles and is characterized by a relatively low metal impurity content. When fumed silica is dispersed in water in the process for producing a polishing composition, it does not completely disintegrate into individual primary particles and therefore can realize an excellent stock removal rate in mechanical polishing.

Some polishing compositions using fumed silica as mentioned above have been proposed, for example, by the inventions disclosed in JP-A-3-60420 and JP-A-3-50112.

The aqueous colloidal dispersion of fumed silica disclosed in JP-A-3-60420 (hereinafter referred to as prior example 1) is an aqueous colloid dispersion containing fumed silica, an acid and a stabilizer and contains at least about 40 wt % of fumed silica dispersed in water, from 0.025 to 0.05 wt %, based on the fumed silica, of an acid and such an amount of a stabilizer as to raise the pH of the dispersion to about 7.0–12.0.

The aqueous colloidal dispersion of fumed silica disclosed in JP-A-3-50112 (hereinafter referred to as prior example 2) is a stable and non-dilatant aqueous colloid dispersion containing no stabilizer and about 35 wt % of fumed silica dispersed in water.

Both prior art examples 1 and 2 are aimed at providing low-viscosity and non-dilatant polishing compositions with excellent dispersity which are stable enough not to gel in at least 1 day.

The present inventors tried preparing polishing compositions using fumed silica, by following prior examples 1 and 2 mentioned above, under the conditions recommended therein.

However, in any cases, fumed silica aggregated in the course of their production, and the resulting compositions turned into gels in extreme cases and were unsuitable for production of semiconductor devices. They tried again under conditions which suppress aggregation and gelation, namely, at the minimum silica concentrations in prior examples 1 and 2, but the polishing compositions obtained underwent agglomeration of fumed silica or gelation immediately after their preparation and were found to be unfavorable upon polishing due to formation of many scratches and instability in the stock removal rate.

The present inventors speculate on the reason for the instability as follows.

Because fumed silica is usually in the form of secondary particles having a chain structure with relatively hydrophobic surfaces, it can not accept water immediatily. However, if it is kept in contact with water, hydroxyl groups form on the surfaces and turn the surfaces hydrophilic. However, after the adjustment to water, the hydroxyl groups thus formed join (presumably by hydrogen bonding or reductive dehydration), and gelation eventually occurs. Therefore, polishing compositions prepared by following prior examples 1 and 2 mentioned above certainly can keep stable dispersity for a short time but can hardly keep it for a long time. In short, in the inventions as prior examples 1 and 2 mentioned above, due to the lack of a step for stabilizing the surfaces of fumed silica as abrasive grains under acidic conditions, the instable state of the surfaces presumably promotes the gelation of polishing compositions.

The present invention has been made to solve the above-mentioned problems and aims at providing a process for polishing compositions with excellent polishing performance which keep fumed silica as abrasive grains dispersed for a long time.

Under the above-mentioned circumstances, the present inventors conducted extensive research and have found out the necessity of a technique which creates surface conditions which suppress aggregation of fumed silica or gelation of polishing compositions for long time stable dispersion of fumed silica, and established the technique.

Namely, the present invention provides a process for producing a polishing composition, which comprises adding fumed silica to water preliminarily adjusted to pH 2–4 to a concentration of 40 to 60 wt % under high shearing force, adjusting the viscosity to 2–10000 cps with water, stirring the mixture under low shearing force for at least 5 minutes, adding water to a fumed silica concentration of 10–38 wt %, and adding a basic substance under vigorous stirring to a pH of 9–12.

The process for producing a polishing composition of the present invention is preferably characterized in that the polishing composition is used for planarization of the surface of semiconductor devices.

Further, the process for producing a polishing composition of the present invention is preferably characterized in that hydrochloric acid is used as an acidic substance for the pH adjustment to 2–4.

The process for producing a polishing composition of the present invention is preferably characterized also in that the fumed silica has a specific surface area of from 70 to 110 m$^2$/g and a bulk density of at least 70 g/L and is dispersed in the water.

The process for producing a polishing composition of the present invention is preferably characterized further in that potassium hydroxide or ammonium hydroxide is used as the basic substance.

The process for producing a polishing composition of the present invention is preferably characterized still further in that the addition of the basic substance under vigorous stirring is followed by filtration through a filter with a pore size of at most 10 μm.

The process for producing a polishing composition of the present invention is preferably characterized further in that the fumed silica in the polishing composition has an average aggregation particle diameter of from 100 to 180 nm.

The process for producing a polishing composition of the present invention is preferably characterized further in that the polishing composition contains not more than 500000 per 0.1 ml of agglomerates not smaller than 0.5 μm, when it is newly produced.

The process for producing a polishing composition of the present invention is preferably characterized further in that the polishing composition contains at most twice as many agglomerates not smaller than 0.5 μm when it is left stand at room temperature for 30 days as when it is newly produced.

Now, the present invention will be describe in detail. The following description is intended to facilitate understanding of the present invention, and by no means restricts the present invention.

In the present invention, as the abrasive grains in the polishing composition, fumed silica having a specific surface area of from 70 to 110 m$^2$/g and a bulk density of at least 70 g/L is used.

In the present invention, the specific surface area is measured by a so-called nitrogen adsorption method (BET method), and this surface area represents the primary particle size. Namely, the primary particle size of the fumed silica in the present invention can be obtained by the formula, primary particle size=2727/(specific surface area), and the surface area of from 70 to 110 m$^2$/g corresponds to the primary particle size of from 24 to 39 nm. The specific surface area or the primary particle size greatly affects the polishing performance. Therefore, a polishing composition prepared by the process of the present invention by using fumed silica having a specific surface area of from 70 to 110 m$^2$/g can attain a high stock removal rate and minimizes formation of scratches.

If the specific surface area is smaller than 70 m$^2$/g, in other words, if the primary particle size is larger than 39 nm, though a sufficient stock removal rate can be attained, scratches tend to be formed unfavorably. If the specific surface area is larger than 110 m$^2$/g, in other words, if the primary particle size is smaller than 39 nm, though scratches are hardly formed, the stock removal rate is impractically low.

In the present invention, the bulk density means the weight per volume of fumed silica simply put into a container. Phenomenally speaking, the bulk density indicates the degree of clustering of primary particles of fumed silica. A low bulk density indicates that they cluster sparsely, and a high bulk density indicates that they cluster closely.

In the process for producing a polishing composition of the present invention, the bulk density, namely the degree of clustering of primary particles, of fumed silica affects the step of dispersing the fumed silica and the quality of the resulting polishing composition. Because fumed silica having a bulk density of at least 70 g/L readily adjusts to water and smoothly disperses in water, such fumed silica readily crumbles and disintegrate readily.

Though fumed silica with a bulk density larger than 120 g/L is not usually commercially available, such fumed silica is presumed to readily crumble and disintegrate to yield a good polishing composition. Because fumed silica having a bulk density smaller than 70 g/L hardly adjusts to water and does not disperse in water, such fumed silica hardly crumbles or disintegrates and can be an obstacle to a polishing composition with good dispersity and result in formation of scratches.

In the process for producing a polishing composition of the present invention, firstly, water is preliminarily adjusted to pH 2–4.

Because the source of fumed silica is generally a chlorine-containing compound, most fumed silica contains residual chlorine on the surfaces of or inside of the particles. Therefore, as it is kept in contact with water, the residual chlorine dissolves in the water and eventually lowers the pH of the whole mixture. If the pH were not lowered preliminarily, in other words, if water at a pH of 4 or more were used, the mixture of fumed silica and the water would be neutral immediately after the addition of the fumed silica, and the surfaces of fumed silica would become terribly instable. Consequently, aggregation of fumed silica and in extreme cases, gelation of the polishing composition, which shorten the lifetime of the product or make formation of scratches more likely, could happen. In contrast, when water preliminarily adjusted to pH 2–4 is used, the final state of the surfaces of fumed silica is very stable, and aggregation of fumed silica and gelation of the polishing composition can be suppressed during storage of the polishing composition. However, pH adjustment to an excessively low level, namely to 2 or less, is undesirable because not only a problem of corrosion of the production apparatus but also problems in polishing performance, disposition and handling safety would arise due to the necessity of a large amount of a basic substance for pH adjustment to 9–12 later on.

The pH adjustment to 2–4 can be readily accomplished with at least one selected from nitric acid, acetic acid, citric acid, tartaric acid, malonic acid and other acidic substances and has an effect of stabilizing the surfaces of the fumed silica in the polishing composition. However, fumed silica as the starting material usually contains residual chlorine, though slight, as mentioned above, mixing with an acidic substance other than hydrochloric acid creates coexistence of plural acidic substances and therefore can make it difficult to adjust the pH or can make the surfaces of fumed silica instable due to coexistence of plural electrolytes. Therefore, as the acidic substance for the pH adjustment, hydrochloric acid is preferred.

In the present invention, though any of industrial water, city water, deionized water, ion exchange water, distilled water, pure water and ultra pure water may be used as the water, water which is almost completely free from impurities such as deionized water ion exchange water, distilled water, pure water or ultra pure water is preferably used because metal impurities are hated in processes for production of semiconductor devices.

The next step in the process for producing a polishing composition of the present invention is preparation of a first mixture by adding from 40 to 60 wt %, preferably from 45 to 52 wt %, of fumed silica to the water preliminarily adjusted to pH 2–4.

The above-mentioned fumed silica concentration makes sure that the resulting first mixture has little fluidity and high viscosity. The mixture in such a state is stirred forcibly by external force, and the resulting high shearing force to the fumed silica partly cleaves the three-dimensional chain structure of fumed silica particles. As a consequence, the fumed silica disintegrates and crumbles to aggregates having small particle sizes.

If the fumed silica concentration were lower than 40 wt %, the secondary particles of fumed silica in the resulting first mixture having low viscosity would not receive high shearing force, and fumed silica would hardly disintegrate or crumble. On the other hand, if the fumed silica concentration were higher than 60 wt %, the resulting first mixture would be substantially solid and have no fluidity, and therefore fumed silica would hardly disintegrate or crumble.

Then, water is added to the first mixture to give a second mixture having a viscosity of from 2 to 10000 cps, and the second mixture is stirred for at least 5 minutes under low shearing force.

The addition of water to the first mixture affords a second mixture having a lower viscosity which can be stirred under low shearing force without generating high shearing force on the fumed silica. By low shearing force, it is intended that the mixture has a viscosity low enough to virtually show physical properties characteristic of the Newtonian fluid, and fumed silica keeps its average aggregation particle size without suffering cleavage of the above-mentioned chain structure. High speed stirring under such low shearing force permits uniform dispersion of fumed silica in the mixture. In the present invention, the viscosity is measured at 25° C. with a Brookfield viscometer (conditions: 30 rpm, spindle 64).

The point of this step is to stabilize fumed silica preliminarily under acidic conditions by stirring under the above-mentioned low shearing force. At least 5 minutes of stirring enables secondary particles of fumed silica to disperse satisfactorily and stabilizes their surfaces under the acidic conditions. Therefore, if the stirring time is shorter than 5 minutes, the fumed silica still has instable surfaces in the next step and yields a polishing composition with poor dispersity.

If water were not added to the first mixture, or if the viscosity of the resulting second mixture were higher than 10000 cps, the secondary particles of fumed silica would not disperse satisfactorily and would have still instable surfaces. On the other hand, if the second mixture had a viscosity lower than 2 cps due to addition of too much water to the first mixture, though the secondary particles of fumed silica would disperse satisfactorily and have stable surfaces, the resulting polishing composition would unfavorably have a fumed silica concentration lower than 10 wt %, which is inadequate for satisfactory polishing performance.

After stirring of the second mixture for at least 5 minutes under low shearing force as mentioned above, water is added to the second mixture to give a third mixture having a fumed silica concentration of from 10 to 38 wt, preferably from 15 to 30 wt %, and the third mixture is adjusted to pH 9–12 with a basic substance under vigorous stirring to give a the polishing composition.

It is generally known that fumed silica dispersed in water remains dispersed stably in the low or high pH region, while it is instable in the neutral region and aggregate, causing gelation of the polishing composition. The present invention requires the above-mentioned step to avoid such a phenomenon. Namely, the mixture is changed in a short time from the stable state in the acidic pH region of 2–4 into the stable state in the alkaline pH region of 9–12 past the transitional instable state (the neutral pH region) by adding a basic substance as quickly as possible under vigorous stirring to prevent re-aggregation of fumed silica particles during the transition.

The addition of water to the second mixture to a fumed silica concentration of 10 to 38 wt % prevents high concentration transition past the neutral region and minimizes re-aggregation of fumed silica particles. Namely, if the fumed silica concentration were higher than 38 wt %, fumed silica particles would be unfavorably likely to aggregate. If the fumed silica concentration were lower than 10 wt %, the resulting polishing composition would unfavorably have a fumed silica concentration lower than 10 wt %, which is inadequate for satisfactory polishing performance.

As the basic substance to be added to the third mixture, either potassium hydroxide or ammonium hydroxide is used.

In the process of the present invention, the addition of a basic substance under vigorous stirring may be followed by filtration through a filter with a pore size of at most 10 $\mu$m.

The purpose of filtration through a filter is to remove foreign matters which have crept in during the process and aggregates of fumed silica. The type of the filter is preferably the absolute type, which allows easy selection of the size of foreign matters and aggregates to be captured.

The pore size of the filter depends on the susceptibility of the object to be polished to scratches and the efficiency in production of the polishing composition. Therefore, use of a finer filter leads to formation of fewer scratches but can lower the production efficiency due to frequent clogging of the filter. According to the present inventors, use of a filter with a pore size of at most 10 $\mu$m prevents problematic formation of scratches. Conversely, use of a filter with a pore size larger than 10 $\mu$m is unfavorably likely to lead to problematic formation of scratches. The filtration through a filter may be performed immediately after production of the polishing composition and/or immediately before its use.

The average aggregation particle size of fumed silica in the polishing composition obtained by the process of the present invention is from 100 to 180 nm.

In the present invention, the average aggregation particle size of fumed silica is measured with CHDF-2000 manufactured by MATEC APPLIED SCIENCES.

The average aggregation particle size is controlled at the time of mixing under high shearing force described above. In other words, the average aggregation particle size of fumed silica in a polishing composition is determined by the degree of disintegration and crumbling of secondary particles of fumed silica resulting from partial cleavage of the three-dimensional chain structure of the fumed silica particles by mixing under high shearing force. The average aggregation particle size of from 100 to 180 nm ensures a polishing composition with good polishing performance and dispersity. If the average aggregation particle size is larger than 180 nm, though the stock removal rate is high, the polishing composition unfavorably has poor dispersity and tends to form problematic scratches. Conversely, if the average aggregation particle size is smaller than 100 nm, though the dispersity is good, the stock removal rate unfavorably tends to be low.

The polishing composition produced as described above contains not more than 500000 per 0.1 ml of aggregates not smaller than 0.5 μm (hereinafter referred to as macroaggregates), when it is newly produced, and contains at most twice as many macroaggregates when it is left stand at room temperature for 30 days as when it is newly produced.

In the present invention, macroaggregates are counted with Accusizer model 780 manufactured by Particle Sizing System.

As described above, because the hydroxyl groups on the surfaces of fumed silica dispersed in water join by hydrogen bonding or reductive dehydration as time passes, aggregation and precipitation of fumed silica or gelation of the polishing composition occurs. This phenomenon is recognized as increase of macroaggregates, which are responsible for formation of scratches during polishing. Therefore, it is preferred to minimize the number of macroaggregates after as well as during its production.

A polishing composition prepared by the process of the present invention is suitable for planarization in production of semiconductor devices, especially for planarization of insulating interlayers. Though insulating layers are classified according to the film formation method as those obtained by thermal oxidation, those obtained by plasma oxidation and those obtained by other methods, a polishing composition obtained by the process of the present invention may be used to polish any insulating layers without any restriction.

A newly produced polishing composition is usually diluted to a fumed silica concentration of from 10 to 15 wt % before use.

Now, the mode of carrying out the present invention will be described in detail with reference to Examples. However, it should be understood that the present invention is by no means restricted to such specific Examples.

EXAMPLES 1 TO 10

70 kg of an acidic water at pH 3 prepared by adding hydrochloric acid to ultra pure water was poured into the mixing tank of a mixer (a shear mixer), and 70 kg of fumed silica having properties (specific surface, primary particle size and bulk density) shown in Table 1 was added step by step (to a fumed silica concentration of 50 wt %) and mixed under high shearing force to give mixture 1. The type of the shear mixer was HDM-250 manufactured by Tokusyu Kika Kogyo Co., Ltd.

Then, mixture 1 was transferred to a tank with a 0.8 m$^2$ capacity, and ultra pure water was added to the viscosities shown in Table 1. The mixtures were vigorously stirred by a power stirred (a homogenizer) under low shearing force at high speed for 10 minutes. Then, ultra pure water was added until the fumed silica concentration decreased to 25 wt % to give mixtures 2.

Such an amount of potassium hydroxide as to raise the pH to 11 was weighed out and added at once to mixtures 2 under high speed stirring, and the mixtures were stirred for a while and diluted with ultra pure water to a fumed silica concentration of 12 wt % to give mixtures 3. Mixtures 3 were filtered through an absolute type filter with a pore size of 10 μm manufactured by Nihon Pall Ltd. to give polishing compositions Examples 1 to 10.

Comparative Example 1

70 kg of an acidic water at pH 3 prepared by adding hydrochloric acid to ultra pure water was poured into the mixing tank of a shear mixer, and 70 kg of fumed silica having a specific surface of 90 m$^2$/g and a bulk density of 80 g/L was added (to a fumed silica concentration of 50 wt %) and mixed under high shearing force in the same manner as in Example 1. The mixture had a very high viscosity even after stirred for a while. As the mixture was not fluidized by subsequent addition of potassium hydroxide, the process was stopped.

Comparative Example 2

70 kg of an acidic water at pH 3 prepared by adding hydrochloric acid to ultra pure water was poured into the mixing tank of a shear mixer, and 70 kg of fumed silica having a specific surface of 70 m$^2$/g and a bulk density of 100 g/L was added (to a fumed silica concentration of 50 wt %) and mixed under high shearing force in the same manner as in Example 1 to give mixture 4.

Then, such an amount of potassium hydroxide as to raise the pH to 11 was weighed out and added at once to mixture 4 under high speed stirring, and the mixture was stirred for a while and diluted with ultra pure water to a fumed silica concentration of 12 wt % to give mixture 5. Mixture 5 was filtered through an absolute type filter with a pore size of 10 μm manufactured by Nihon Pall Ltd. to give polishing compositions Comparative Example 1.

With the respective polishing compositions Examples 1 to 10 and Comparative Example 2, measurements of average aggregation particle size and the number of macroaggregates immediately after production and after 30 days of storage at room temperature and polishing test were done. The measurements and polishing test were done under the following conditions.

Average Aggregation Particle Size

CHDF-2000 manufactured by MATEC APPLIED SCIENCES.

The Number of Macroaggregates

AccuSizer model 780 manufactured by Particle Sizing System

Polishing Test

Polishing machine: AVANTI 472 (manufactured by Westech)
Polishing time: 3 minutes
Object: 8-inch P-TEOS film wafer
Polishing pad: IC-1000 perforated/Suba400 (manufactured by Rodel Inc.)
Platen rotational speed: 35 rpm
Carrier rotational speed: 70 rpm
Down force: 7.0 psi
Polishing composition supply feed rate: 150 ml/min After polishing, wafers were washed and dried one by one, and the thickness loss by polishing was measured at 49 points per wafer with an optical thicknessmeter Lambda-Ace (manufactured by DAINIPPON SCREEN MFG Co., Ltd.), and the stock removal amount per unit time (minute) (stock removal rate) was determined for each polished object. The scratches on each polished wafer were counted by using a laser surface inspector LS-6000 manufactured by Hitachi Electronics Engineering Co., Ltd.).

In the polishing test, the following evaluation scales were used.

Stock Removal Rate

◎: Stock removal rate of 2000 Å/min or above
○: Stock removal rate of 1500 Å/min or above but below 2000 Å/min
X: Stock removal rate below 1500 Å/min Scratches ◎: Less than 100 scratches
○: At least 100 but less than 300 scratches
X: At least 300 scratches Overall Evaluation ◎: Rated as ◎ for both stock removal rate and scratches
○: Rated as ○ for either stock removal rate or scratches and rated as X for neither stock removal rate nor scratches
X: Rated as X for either stock removal rate or scratches or difficulty in production or problem in safety The results of the above-mentioned measurements and polishing test and evaluation are shown in Table 1.

scratches, and especially, Examples 2 to 10 obtained by using fumed silica having a specific surface area of at least 70 m²/g formed much fewer scratches. The low stock removal rate of Example 5 as compared with that of Comparative Example 2 suggests that fumed silica having a specific surface area of at most 110 m²/g is preferred. Anyway, Examples 1 to 10 were evaluated higher than Comparative Example 2 overall.

Comparison of Examples 6 to 9 with respect to the bulk density of fumed silica reveals that Example 6 obtained by using fumed silica having a bulk density less than 70 g/L formed more scratches and contained more macroaggregates than Examples 7 to 9 both immediately and 30 minutes after the production and that the increase in the bulk density was accompanied by decrease in the number of scratches decreased and increase in the stock removal rate. However, because commercially available fumed silica usually does not have a bulk density higher than 120 g/L, it is preferred to use fumed silica having a bulk density of from 70 to 120 g/L.

The fumed silica having a specific surface of 90 m²/g and a bulk density of 80 g/L used in Comparative Example 1 did not afford a mixture having enough fluidity to give a polishing composition at a fumed silica concentration of 50

TABLE 1

| | Fumed silica | | | Polishing composition | | Number of macroaggregates (/0.1 ml) | | Stock removal rate (Å/min) | |
|---|---|---|---|---|---|---|---|---|---|
| | Specific Surface area (m²) | Primary particle size (nm) | Bulk density (g/l) | Viscosity of second mixture (cps) | pH | Average aggregation particle size (nm) | Immediately after production | After 30 days | Immediately after production | After 30 days |
| Ex. 1 | 62 | 44 | 83 | 1300 | 11.1 | 152 | 348000 | 552000 | 2470 | 2450 |
| Ex. 2 | 71 | 38 | 80 | 1430 | 11.0 | 145 | 401200 | 560300 | 2430 | 2410 |
| Ex. 3 | 95 | 29 | 82 | 1620 | 10.9 | 138 | 332600 | 492000 | 2390 | 2350 |
| Ex. 4 | 108 | 25 | 77 | 1670 | 11.1 | 135 | 285900 | 385000 | 2100 | 2130 |
| Ex. 5 | 132 | 21 | 86 | 1730 | 10.9 | 132 | 357000 | 465200 | 1820 | 1850 |
| Ex. 6 | 91 | 30 | 65 | 1660 | 11.0 | 137 | 304500 | 983400 | 2260 | 2300 |
| Ex. 7 | 91 | 30 | 73 | 1630 | 11.0 | 135 | 313000 | 492400 | 2350 | 2360 |
| Ex. 8 | 91 | 30 | 85 | 1640 | 11.1 | 138 | 326400 | 494610 | 2370 | 2390 |
| Ex. 9 | 91 | 30 | 94 | 1690 | 11.1 | 133 | 345200 | 509500 | 2390 | 2400 |
| Ex. 10 | 72 | 38 | 120 | 1480 | 11.0 | 143 | 397800 | 502300 | 2400 | 2410 |
| Comp. Ex. 1 | 90 | 30 | 80 | — | — | — | — | — | — | — |
| Comp. Ex. 2 | 70 | 39 | 100 | 15750 | 11.0 | 140 | 636800 | 3375000 | 2250 | 2240 |

| | Scratches | | | |
|---|---|---|---|---|
| | Immediately after production | After 30 days | Remarks | Overall evaluation |
| Ex. 1 | 163 | 180 | | ○ |
| Ex. 2 | 89 | 82 | | ◎ |
| Ex. 3 | 35 | 32 | | ◎ |
| Ex. 4 | 32 | 34 | | ◎ |
| Ex. 5 | 33 | 35 | | ○ |
| Ex. 6 | 72 | 123 | | ○ |
| Ex. 7 | 42 | 45 | | ◎ |
| Ex. 8 | 38 | 35 | | ◎ |
| Ex. 9 | 33 | 31 | | ◎ |
| Ex. 10 | 40 | 45 | | ○ |
| Comp. Ex. 1 | — | — | Difficulty in stirring | X |
| Comp. Ex. 2 | 327 | 350 | Poor polishing performance | X |

From Table 1, it is evident that as compared with Comparative Example 2, Examples 1 to 10 formed fewer wt %. This is explained by the insufficient stabilization of fumed silica surfaces attributable to the omission of preparation of the second mixture. In Comparative Example 2, though the fumed silica having a smaller specific surface area as compared with that used in Example 1 formed a fluid mixture, the number of macroaggregates had increased by 5.3 times 30 days after the production, and more than 300 scratches were formed. Therefore, the polishing composition obtained in comparative Example 2 was poor in dispersity and polishing performance. EXAMPLES 11 to 28 and Comparative Examples 3 TO 5, 8, 10, 12 AND 13

70 kg of acidic waters at pHs shown in Table 2 prepared by adding various amounts of hydrochloric acid to ultra pure water were poured into the mixing tank of a shear mixer, and fumed silica having a specific surface of 95 $m^2/g$ and a bulk density of 100 g/L was added to the concentrations shown in Table 2 and mixed under high shearing force to give mixtures 6.

Then, mixtures 6 were transferred to a tank with a 0.8 $m^2$ capacity, and ultra pure water was added to the viscosities shown in Table 2. The mixtures were stirred by a homogenizer under low shearing force at high speed for the periods of time shown in Table 2. Then, ultra pure water was added until the fumed silica concentration decreased to the values shown in Table 2 to give mixtures 7.

Such amounts of potassium hydroxide as to raise the pH to the values shown in Table 2 were weighed out and added at once to mixtures 7 under high speed stirring (vigorous stirring), and the mixtures were stirred for a while and diluted with ultra pure water to a fumed silica concentration of 12 wt % to give mixtures 8. Mixtures 8 were filtered through an absolute type filter with a pore size of 10 μm manufactured by Nihon Pall Ltd. to give polishing compositions Examples 11 to 28, Comparative Examples 3 to 5, 8, 10, 12 and 13.

Compatative Examples 6, 7, 9 and 11

70 kg of an acidic water at pH 3 prepared by adding hydrochloric acid to ultra pure water was poured into the mixing tank of a shear mixer, and 163.3 kg of fumed silica having a specific surface of 95 $m^2/g$ and a bulk density of 100 g/L was added (to a fumed silica concentration of 70 wt %) and mixed under high shearing force in the same manner as in Example 1. Though the mixture was stirred for a while, it never became fluid and turned substantially solid, and therefore the process was stopped.

In Comparative Examples 7, 9 and 11, the same procedure as in Examples 11 to 28 was followed except that the viscosity of mixture 6 was changed. However, due to unsuccessful filtration of mixtures 8 through an absolute type filter with a pore size of 10 μm manufactured by Nihon Pall Ltd., no polishing compositions were obtained.

With the respective polishing compositions Examples 11 to 28 and Comparative Example 3 to 13, measurements of average aggregation particle size and the number of macroaggregates immediately after production and after 30 days of storage at room temperature and polishing test were done, in the same manners as for Examples 1 to 10 and Comparative Example 2. The results are shown in Table 2.

TABLE 2

| | pH of acidic water | Concentration of first mixture (wt %) | Viscosity of second mixture (cps) | Stirring time under low shearing force (min) | Concentration of third mixture (wt %) | pH | Polishing composition Average aggregation particle size (nm) | Number of macroaggregates (/0.1 ml) Immediately after production | After 30 days | Stock removal rate (Å/min) Immediately after production | After 30 days |
|---|---|---|---|---|---|---|---|---|---|---|---|
| Ex. 11 | 2.0 | 50 | 1300 | 10 | 32 | 11.0 | 139 | 342300 | 515600 | 2410 | 2390 |
| Ex. 12 | 3.2 | 50 | 1320 | 10 | 32 | 11.0 | 137 | 335600 | 521200 | 2380 | 2400 |
| Ex. 13 | 3.8 | 50 | 1530 | 10 | 32 | 11.0 | 132 | 356400 | 532500 | 2290 | 2310 |
| Ex. 14 | 4.0 | 50 | 1630 | 10 | 32 | 11.1 | 136 | 320500 | 563400 | 2250 | 2270 |
| Ex. 15 | 3.0 | 40 | 1550 | 10 | 32 | 11.1 | 155 | 315500 | 452300 | 2400 | 2380 |
| Ex. 16 | 3.0 | 50 | 1630 | 10 | 32 | 11.1 | 132 | 336500 | 545600 | 2330 | 2350 |
| Ex. 17 | 3.0 | 60 | 1710 | 10 | 32 | 11.0 | 125 | 285600 | 400200 | 2310 | 2320 |
| Ex. 18 | 3.0 | 50 | 10000 | 10 | 32 | 11.1 | 134 | 383400 | 552900 | 2380 | 2350 |
| Ex. 19 | 3.0 | 50 | 1000 | 10 | 32 | 11.0 | 136 | 342600 | 519500 | 2430 | 2400 |
| Ex. 20 | 3.0 | 50 | 2 | 10 | 32 | 11.0 | 135 | 335440 | 497800 | 2310 | 2320 |
| Ex. 21 | 3.0 | 50 | 1560 | 5 | 32 | 11.1 | 139 | 356200 | 501300 | 2350 | 2320 |
| Ex. 22 | 3.0 | 50 | 1770 | 10 | 32 | 11.0 | 135 | 347100 | 492100 | 2310 | 2300 |
| Ex. 23 | 3.0 | 50 | 1620 | 10 | 10 | 11.0 | 135 | 347600 | 498900 | 2290 | 2230 |
| Ex. 24 | 3.0 | 50 | 1720 | 10 | 25 | 11.0 | 136 | 342200 | 501200 | 2360 | 2350 |
| Ex. 25 | 3.0 | 50 | 1680 | 10 | 30 | 11.1 | 139 | 373400 | 513300 | 2400 | 2410 |
| Ex. 26 | 3.0 | 50 | 1580 | 10 | 38 | 11.0 | 137 | 354500 | 504500 | 2390 | 2500 |
| Ex. 27 | 3.0 | 50 | 1610 | 10 | 32 | 9.0 | 139 | 453700 | 745600 | 2360 | 2380 |
| Ex. 28 | 3.0 | 50 | 1480 | 10 | 32 | 12.0 | 136 | 354400 | 472400 | 2560 | 2540 |
| Comp. Ex. 3 | 1.5 | 50 | 1250 | 10 | 32 | 11.1 | 140 | 374500 | 564500 | 2250 | 2210 |
| Comp. Ex. 4 | 5.1 | 50 | 1790 | 10 | 32 | 11.1 | 139 | 286500 | 775200 | 2320 | 2350 |
| Comp. Ex. 5 | 3.0 | 35 | 1360 | 10 | 32 | 11.0 | 216 | 875900 | 1035600 | 2350 | 2340 |
| Comp. Ex. 6 | 3.0 | 70 | — | — | — | — | — | — | — | — | — |
| Comp. Ex. 7 | 3.0 | 50 | 11000 | 10 | 32 | 11.1 | 138 | — | — | — | — |
| Comp. Ex. 8 | 3.0 | 50 | 1.5 | 10 | 32 | 11.0 | 137 | 347800 | 522500 | 1450 | 1420 |
| Comp. | 3.0 | 50 | 1670 | 3 | 32 | 11.0 | 137 | — | — | — | — |

TABLE 2-continued

| | | | | | | | | | | | |
|---|---|---|---|---|---|---|---|---|---|---|---|
| Ex. 9 | | | | | | | | | | | |
| Comp. Ex. 10 | 3.0 | 50 | 1590 | 10 | 5 | 11.0 | 137 | 362800 | 485900 | 1400 | 1360 |
| Comp. Ex. 11 | 3.0 | 50 | 1450 | 10 | 42 | — | — | — | — | — | — |
| Comp. Ex. 12 | 3.0 | 50 | 1540 | 10 | 32 | 8.0 | 141 | gel | gel | — | — |
| Comp. Ex. 13 | 3.0 | 50 | 1510 | 10 | 32 | 13.0 | 135 | — | — | — | — |

| | Scratches | | | |
|---|---|---|---|---|
| | Immediately after production | After 30 days | Remarks | Overall evaluation |
| Ex. 11 | 35 | 38 | | ◎ |
| Ex. 12 | 31 | 32 | | ◎ |
| Ex. 13 | 43 | 41 | | ◎ |
| Ex. 14 | 132 | 154 | | ○ |
| Ex. 15 | 40 | 44 | No difficulty in stirring | ◎ |
| Ex. 16 | 33 | 31 | No difficulty in stirring | ◎ |
| Ex. 17 | 31 | 35 | Slight difficulty in stirring | ◎ |
| Ex. 18 | 36 | 38 | | ◎ |
| Ex. 19 | 31 | 35 | | ◎ |
| Ex. 20 | 35 | 38 | | ◎ |
| Ex. 21 | 40 | 41 | | ◎ |
| Ex. 22 | 37 | 35 | | ◎ |
| Ex. 23 | 34 | 41 | | ◎ |
| Ex. 24 | 35 | 38 | | ◎ |
| Ex. 25 | 34 | 36 | | ◎ |
| Ex. 26 | 31 | 35 | | ◎ |
| Ex. 27 | 43 | 45 | | ◎ |
| Ex. 28 | 39 | 40 | | ◎ |
| Comp. Ex. 3 | 40 | 43 | Problematic in safety | × |
| Comp. Ex. 4 | 330 | 342 | | × |
| Comp. Ex. 5 | 146 | 368 | No difficulty in stirring, poor filtrability | × |
| Comp. Ex. 6 | — | — | Difficulty in stirring | × |
| Comp. Ex. 7 | — | — | Aggregation, precipitation, not filtrable | × |
| Comp. Ex. 8 | 30 | 32 | Low stock removal rate | × |
| Comp. Ex. 9 | — | — | Aggregation, not filtrable | × |
| Comp. Ex. 10 | 32 | 35 | Low stock removal rate | × |
| Comp. Ex. 11 | — | — | Aggregation, precipitation, not filtrable | × |
| Comp. Ex. 12 | — | — | | × |
| Comp. Ex. 13 | — | — | Dissolution of fumed silica | × |

As is evident from Table 2, when the acidic water had a pH lower than 2 before mixed with fumed silica as in Comparative Example 3, good polishing performance was obtained, but due to the greatness of the amount of hydrochloric acid used for preparation of the acidic water and the amount of ammonium hydroxide used for alkalinization, the polishing composition was unfavorable in respect of handling safety and production cost. When an acidic water at a pH higher than 4 was used as in Comparative Example 4, many scratches formed, while when the pH of the acidic water was from 2 to 4 as in Examples 11 to 28, there was no large increase of macromolecules, no aggregation of fumed silica and no gelation of the polishing composition, and good polishing performance was obtained.

When the fumed silica concentration was below 40 wt % as in Comparative Example 5, the average aggregation particle size was large, macroaggregates were plentiful, and more than 300 scratches formed, because the chain structure of fumed silica was not cleaved satisfactorily under high shearing force.

Further, when the fumed silica concentration was above 60 wt % as in Comparative Example 6, no polishing composition was obtained because the mixture was substantially solid.

In contrast, when the fumed silica concentration was from 40 to 60 wt % as in Examples 11 to 28, polishing compositions were obtained without difficulty.

When sufficient water was not added after stirring under high shearing force (the viscosity was higher than 10000 cps) as in Comparative Example 7, because the stirring under low shearing force was insufficient, the fumed silica particles did not disperse well, and filtration through a filter was unsuccessful. When the viscosity was lower than 2 cps as in Comparative Example 8, the addition of excessive water lowered the fumed silica concentration of the resulting polishing composition to less than 10 wt % and end up in the stock removal rate lower than 2000 Å/min.

In contrast, when the viscosity was from 2 to 10000 cps as in Examples 11 to 28, fumed silica particles dispersed well under low shearing force, the final fumed silica concentrations of the polishing compositions were higher than 10 wt %, and good polishing performance was obtained.

When the stirring under low shearing force lasted less than 5 minutes as in Comparative Example 9, the fumed silica particles did not disperse well, and no polishing composition was obtained due to the failure in filtration, while when the stirring under low shearing force was continued for at least 5 minutes as in Examples 11 to 28, polishing compositions with good polishing performance in which fumed silica particles were well dispersed were obtained.

When the fumed silica concentration was lower than 10 wt % before the addition of ammonium hydroxide as in Comparative Example 10, the fumed silica concentration of the resulting polishing composition was less than 10 wt %, and the stock removal rate was low. When the fumed silica concentration was above 38 wt % before the addition of ammonium hydroxide as in Comparative Example 11, the fumed silica re-aggregated before the addition of ammonium hydroxide, and no polishing composition was obtained due to the failure in filtration through a filter. In contrast, when the fumed silica concentration was from 10 to 38 wt % as in Examples 11 to 28, there was no re-aggregation of fumed silica or difficulty in filtration through a filter, and good polishing performance was obtained.

When the pH after the addition of ammonium hydroxide was below 9 as in Comparative Example 12, gelation occurred during the addition of ammonium hydroxide, and no polishing composition was obtained due to the failure in filtration through a filter. When the pH after the addition of ammonium hydroxide exceeded 12 as in Comparative Example 13, stable polishing performance was not obtained due to gradual dissolution of fumed silica.

On the other hand, when the pH after the addition of ammonium hydroxide was from 9 to 12 as in Examples 11 to 28, gelation did not occur during the addition of ammonium hydroxide, and good dispersibility was obtained. Further, the fumed silica did not dissolve, and the polishing performance was stable.

As described above, the process for producing a polishing composition of the present invention comprises preliminarily adjusting water to pH 2–4, adding from 40 to 60 wt % of fumed silica to the water under high shearing force, adding water to lower the viscosity to 2–10000 cps, stirring the mixture under low shearing force for at least 5 minutes, adding water to lower the fumed silica concentration to 10–38 wt %, and adding a basic substance under vigorous stirring to raise the pH to 9–12.

It can produce a polishing composition with such stable dispersity that gelation does not occur for a long time and macroaggregates do not increase and with good polishing performance.

The process for producing a polishing composition of the present invention is suitable for production of polishing compositions for use in planarization of semiconductor devices, especially effective in planarization of insulating interlayers.

Further, by virtue of the use of hydrochloric acid as an acidic substance for the pH adjustment to 2–4, the process for producing a polishing composition of the present invention has no difficulty in the pH adjustment attributable to the residual chlorine in fumed silica and can avoid the coexistence of plural electrolytes which makes the surfaces of fumed silica instable.

By virtue of the use of fumed silica having a specific surface of from 70 to 110 $m^2$/g and a bulk density of at least 70 g/L, the process for producing a polishing composition of the present invention has no difficulty in adjustment of fumed silica to water for smooth dispersion of fumed silica in water and therefore facilitates disintegration and crumbling of fumed silica, and can provide a polishing composition which can attain a good stock removal rate and hardly forms scratches.

The use of potassium hydroxide or ammonium hydroxide as a basic substance in the process for producing a polishing composition of the present invention enables quick transition of the mixture from the stable state in the acidic pH region of 2–4 into the stable state in the alkaline pH region of 9–12 without re-aggregation of fumed silica during the transition.

The filtration through a filter with a pore size of at most 10 $\mu$m in the process for producing a polishing composition of the present invention makes it possible to remove foreign matters which have crept in during the process and aggregates of fumed silica and to produce a polishing composition which hardly forms scratches on polished objects.

A polishing composition produced by the process for producing a polishing composition of the present invention has an average aggregation particle size of from 100 to 180 nm and therefore is excellent in polishing performance and dispersity.

A polishing composition produced by the process for producing a polishing composition of the present invention contains not more than 500000 per 0.1 ml of aggregates not smaller than 0.5 $\mu$m, when it is newly produced and therefore hardly forms scratches.

A polishing composition produced by the process for producing a polishing composition of the present invention contains at most twice as many aggregates not smaller than 0.5 $\mu$m when it is left stand at room temperature for 30 days as when it is newly produced and therefore shows good dispersity over a long time and hardly forms scratches.

What is claimed is:

1. A process for producing a polishing slurry which comprises preliminarily adjusting water to pH 2–4, adding from 40 to 60 wt % of fumed silica having a 3-dimensional chain structure to the water under a shearing force sufficient to cleave the three-dimensional chain structure of fumed silica particles and cause said particles to disintegrate and crumble into aggregates, adding water to lower the viscosity to 2–10000 cps, stirring the mixture under a shearing force for at least 5 minutes sufficient to maintain the viscosity low enough to show physical properties characteristic of a Newtonian fluid and maintain average aggregation particle size without further cleavage of said chain structure, adding water to lower the fumed silica concentration to 10–38 wt %, and adding a basic substance under vigorous stirring 2 to raise the pH to 9–12.

2. The process according to claim 1, wherein hydrochloric acid is used as an acidic substance for the pH adjustment to 2–4.

3. The process according to claim 1, wherein the fumed silica has a specific surface area of from 70 to 110m$^2$/g and a bulk density of at least 70 g/L.

4. The process according to claim 1, wherein potassium hydroxide or ammonium hydroxide is used as the basic substance.

5. The process according to claim 1, wherein the addition of the basic substance under vigorous stirring is followed by filtration through a filter with a pore size of at most 10 μm.

6. The process according to claim 1, wherein the fumed silica in the polishing slurry has an average aggregation particle diameter of from 100 to 180 nm.

7. The process according to claim 1, wherein the polishing slurry contains not more than 500000 aggregates of a size not smaller than 0.5 μm per 0.1 ml of slurry, upon production of the slurry.

8. The process according to claim 1, wherein the polishing slurry contains at most twice as many aggregates of a size not smaller than 0.5 μm when the slurry is left standing at room temperature for 30 days as when the slurry is produced initially.

* * * * *